(12) United States Patent
Sakai et al.

(10) Patent No.: US 9,776,333 B2
(45) Date of Patent: Oct. 3, 2017

(54) HAND MEMBER AND HAND

(71) Applicant: Hirata Corporation, Kumamoto-shi, Kumamoto-ken (JP)

(72) Inventors: Tetsuya Sakai, Kumamoto (JP); Hideki Sakaue, Kumamoto (JP)

(73) Assignee: HIRATA CORPORATION, Kumamoto-Shi, Kumamoto-Ken (JP)

( * ) Notice: Subject to any disclaimer, the term of this patent is extended or adjusted under 35 U.S.C. 154(b) by 0 days.

(21) Appl. No.: 15/337,073

(22) Filed: Oct. 28, 2016

(65) Prior Publication Data

US 2017/0144313 A1 May 25, 2017

(30) Foreign Application Priority Data

Nov. 24, 2015 (JP) ................................. 2015-228949

(51) Int. Cl.
*H01L 21/687* (2006.01)
*B25J 15/00* (2006.01)
*B25J 11/00* (2006.01)

(52) U.S. Cl.
CPC ....... *B25J 15/0014* (2013.01); *B25J 11/0095* (2013.01); *H01L 21/68707* (2013.01)

(58) Field of Classification Search
CPC .............. B25J 11/0095; B25J 15/0014; H01L 21/68707; H01L 21/6838; Y10S 294/902; Y10S 414/141
USPC ........................................................ 294/213
See application file for complete search history.

(56) References Cited

U.S. PATENT DOCUMENTS

| | | | | |
|---|---|---|---|---|
| 5,061,144 A * | 10/1991 | Akimoto | ................... | G03F 7/26 118/500 |
| 5,700,046 A * | 12/1997 | Van Doren | ....... | H01L 21/68707 294/119.1 |
| 6,168,669 B1 * | 1/2001 | Yasuda | ............. | H01L 21/68707 118/719 |
| 7,032,287 B1 * | 4/2006 | Spady | ............... | H01L 21/68707 118/500 |
| 7,048,316 B1 * | 5/2006 | Blank | ............... | H01L 21/67748 294/213 |
| 7,344,352 B2 * | 3/2008 | Gueler | ............. | H01L 21/68707 294/118 |
| 8,528,889 B2 * | 9/2013 | Nakano | ............. | H01L 21/67742 269/289 R |
| 9,177,850 B2 | 11/2015 | Takahashi | | |
| 2003/0234548 A1* | 12/2003 | Aggarwal | ........... | H01L 21/6838 294/188 |
| 2014/0306474 A1* | 10/2014 | Schrameyer | ...... | H01L 21/68707 294/213 |

FOREIGN PATENT DOCUMENTS

| | | |
|---|---|---|
| JP | 2001-223252 A | 8/2001 |
| JP | 4038653 B2 | 1/2008 |
| JP | 4740188 B2 | 8/2011 |
| JP | 5548163 B2 | 7/2014 |

* cited by examiner

*Primary Examiner* — Dean Kramer
(74) *Attorney, Agent, or Firm* — Buchanan Ingersoll & Rooney PC

(57) ABSTRACT

A hand member forms a hand of a robot arm for transferring a semiconductor wafer. The hand member is a U-shaped member on which the semiconductor wafer is placed. The hand member includes at least one fitting portion on which a frictional holding member for holding the semiconductor wafer is fitted sideways, on each of an inner edge and an outer edge.

11 Claims, 7 Drawing Sheets

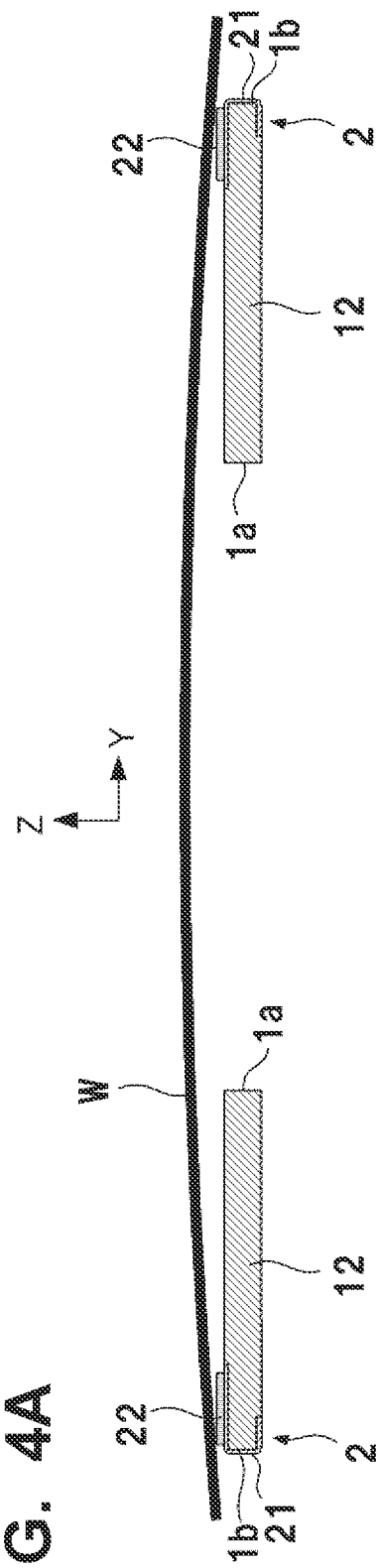
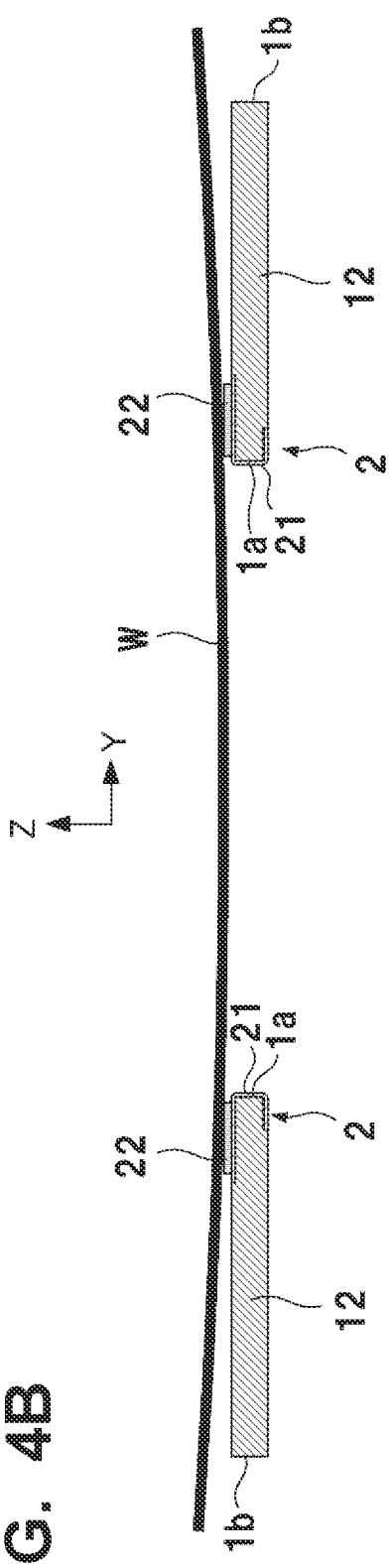

HAND MEMBER AND HAND

BACKGROUND OF THE INVENTION

Field of the Invention

The present invention relates to a hand of a robot arm for transferring a semiconductor wafer.

Description of the Related Art

In semiconductor manufacturing processes, a substrate transfer apparatus is used to transfer semiconductor wafers between processing apparatuses. This substrate transfer apparatus includes a robot arm, and a hand at the distal end of the robot arm supports a wafer (Japanese Patent Laid-Open No. 2001-223252 and Japanese Patent Nos. 4038653, 4740188, and 5548163).

A wafer sometimes deforms as a result of processing. For example, a wafer sometimes warps or bends due to the influence of heat in a heating process. If a wafer has deformed, the wafer may be damaged or misaligned because the hand and the wafer come in contact with each other in an unexpected portion. Therefore, structures in which frictional holding members made of rubber or the like are formed on a hand member forming a hand main body have been proposed (Japanese Patent Laid-Open No. 2001-223252 and Japanese Patent Nos. 4038653 and 4740188).

The frictional holding members are expendables, so their replacement is desirably easy.

SUMMARY OF THE INVENTION

The present invention enables improvement of the easiness of replacement of the frictional holding members.

According to an aspect of the present invention, there is provided a hand member forming a hand of a robot arm for transferring a semiconductor wafer, wherein the hand member is a U-shaped member on which the semiconductor wafer is placed, and the hand member comprises at least one fitting portion on which a frictional holding member for holding the semiconductor wafer is fitted sideways, on each of an inner edge and an outer edge.

According to another aspect of the present invention, there is provided a hand member forming a hand of a robot arm for transferring a semiconductor wafer, wherein the hand member is a U-shaped member which is made of a difficult-to-cut material, and on which the semiconductor wafer is placed, the hand member comprises at least one fitting portion on which a frictional holding member for holding the semiconductor wafer is fitted sideways, on each of an inner edge and an outer edge, each fitting portion is a portion thinner than a periphery thereof, and at least three fitting portions in total are formed.

According to still another aspect of the present invention, there is provided a hand of a robot arm for transferring a semiconductor wafer, comprising: a U-shaped hand member on which the semiconductor wafer is placed; and a plurality of frictional holding members configured to hold the semiconductor wafer, wherein the hand member comprises fitting portions on which the plurality of frictional holding members are fitted sideways, on an inner edge and an outer edge.

Further features of the present invention will become apparent from the following description of exemplary embodiments (with reference to the attached drawings).

BRIEF DESCRIPTION OF THE DRAWINGS

FIGS. 4A and 4B are views showing examples of the placement of curved semiconductor wafers;

DESCRIPTION OF THE EMBODIMENTS

Figure 1:
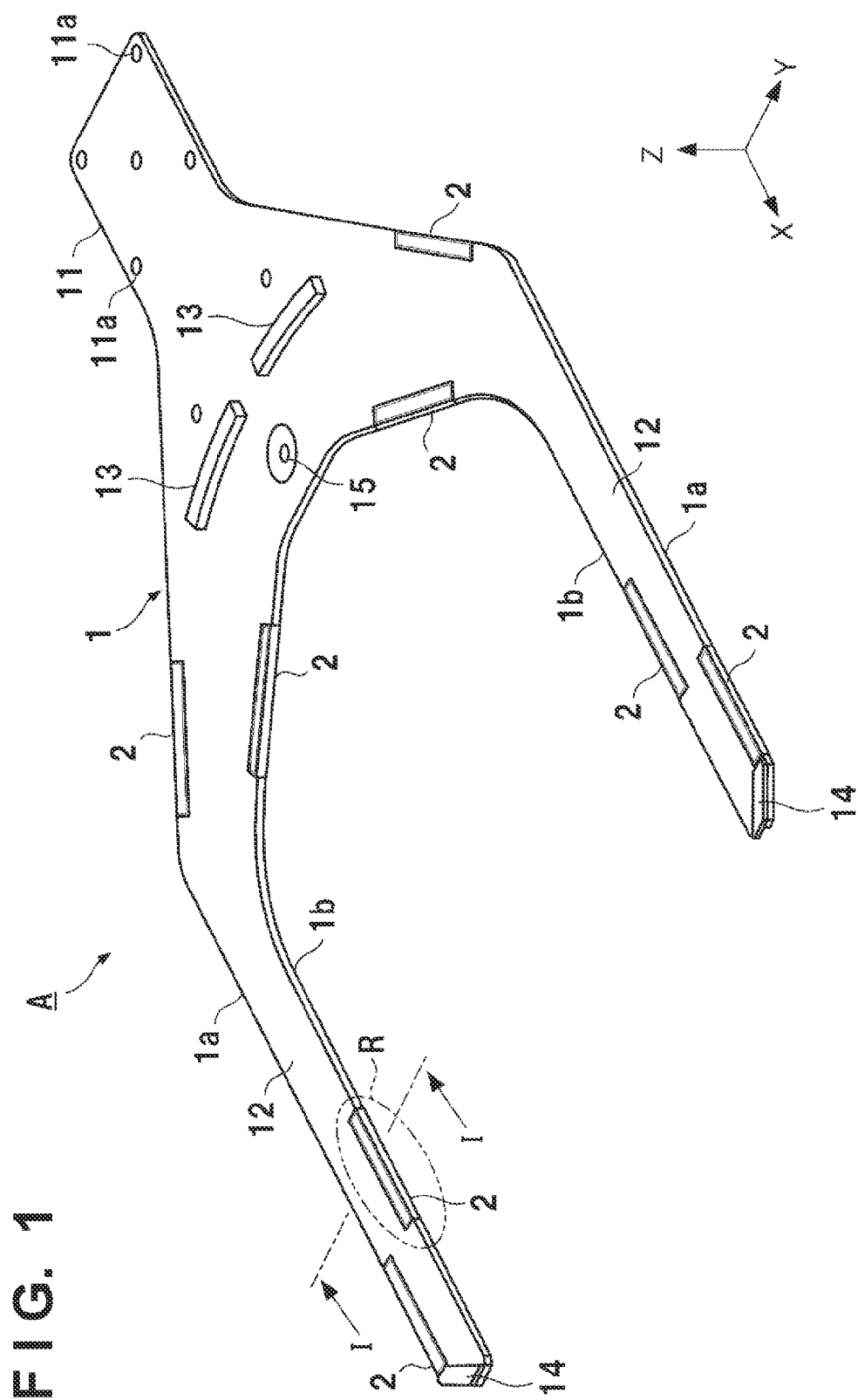
FIG. 1 is a perspective view of a hand according to an embodiment of the present invention.

A hand according to an embodiment of the present invention will be explained with reference to the accompanying drawings. Note that in each drawing, arrows X and Y indicate horizontal directions perpendicular to each other, and an arrow Z indicates the vertical direction. The directions of the hand in the drawings indicate examples of directions when the hand is horizontally supported by a robot arm.

Figure 2A:
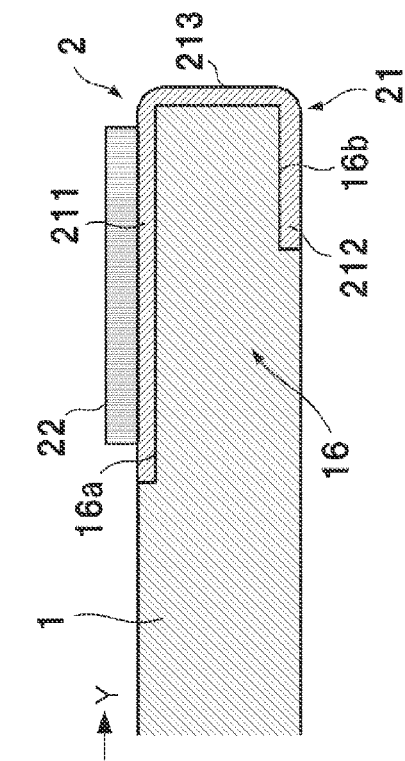
FIG. 2A is an exploded perspective view of a frictional holding member and fitting portion.
Figure 2B:
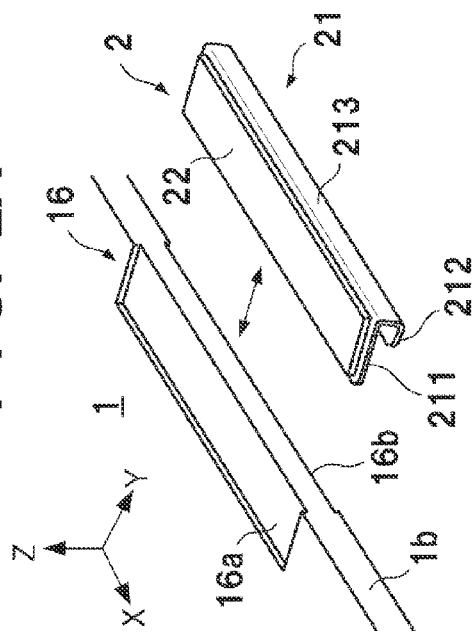
FIG. 2B is a sectional view taken along a line I-I in FIG. 1.
Figure 2C:
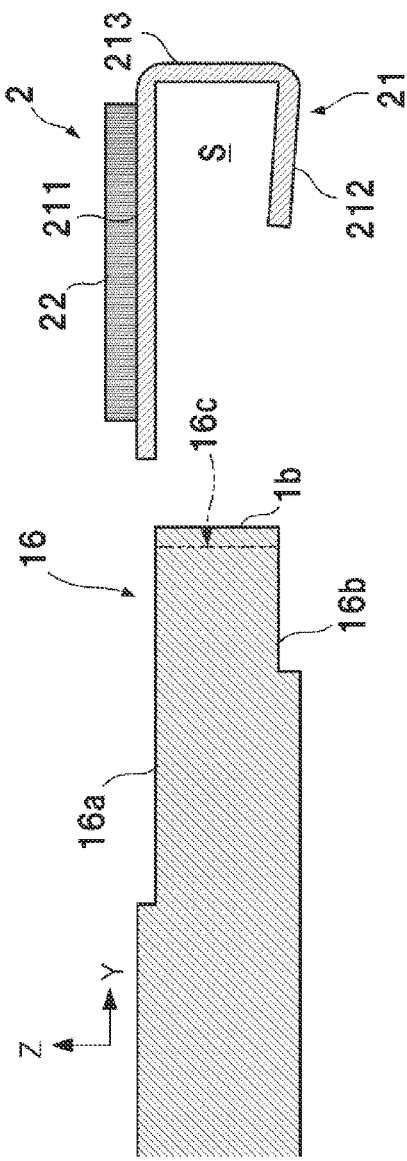
FIG. 2C is a sectional view of a state in which the frictional holding member and fitting portion are detached.

FIG. 1 is a perspective view of a hand A according to the embodiment of the present invention. The hand A includes a hand member 1 and a plurality of frictional holding members 2. FIG. 2A is an exploded view of the frictional holding member 2 and hand member 1 in a region R shown in FIG. 1. FIG. 2B is a sectional view taken along a line I-I in FIG. 1. FIG. 2C is a view showing a state in which the frictional holding member 2 is detached from a fitting portion 16 in FIG. 2B.

The hand member 1 is a plate-like member on which a semiconductor wafer is placed, and is formed by, for example, a difficult-to-cut material. Examples of the difficult-to-cut material are a ceramics material and carbon material.

The hand member 1 is a main body of the hand A, includes an attaching portion 11 to be fixed to a robot arm (not shown), and is horizontally supported by the robot arm. A plurality of holes 11a to be fixed to the robot arm are formed in the attaching portion 11. The hand member 1 includes a pair of fingers 12 extending in the form of a fork in the X direction, and is formed into a U shape as a whole.

Regulating members 13 and 14 are formed on the upper surface of the hand member 1. The regulating members 13 and 14 position a semiconductor wafer to be placed, and prevent falling of the semiconductor wafer during transfer. The regulating members 13 and 14 can be members molded to be integrated with the hand member 1, and can also be members detachable from the hand member 1.

The regulating member 13 is an arc-shaped member in a planar view. In this embodiment, two regulating members 13 are formed in a region of the upper surface of the hand member 1, between the attaching portion 11 and the pair of fingers 12. The inner side surface of the regulating member 13 curved into an arc shape faces the edge of a semiconductor wafer to be placed, and, if the semiconductor wafer is misaligned, prevents falling of the semiconductor wafer by abutting against the edge of the wafer.

The regulating member 14 is a quadrangular member in a planar view. In this embodiment, one regulating member 14 is formed at the distal end portion of each finger 12. The inner side surface of the regulating member 14 having a planar shape faces the edge of a semiconductor wafer to be placed, and, if the semiconductor wafer is misaligned, prevents falling of the wafer by abutting against the edge of the wafer.

The hand member 1 also includes a chucking portion 15. The chucking portion 15 includes a hole formed in the upper surface of the hand member 1, and an abutting member attached to the hole, and communicates with an air suction device (not shown). A semiconductor wafer to be placed can be chucked and held by sucking air in the chucking portion 15. Therefore, the semiconductor wafer can reliably be held even when rapidly transferred.

Note that this embodiment includes both the regulating members 13 and 14 and the chucking portion 15. However, it is also possible to adopt an arrangement having no chucking portion 15. On the other hand, an arrangement not including the regulating members 13 and 14 can also be adopted.

The frictional holding members 2 are fitted sideways on an inner edge 1b and an outer edge 1a of the hand member 1. The frictional holding members 2 hold a semiconductor wafer to be placed by a frictional force with respect to the wafer. As shown in FIG. 2A, on the inner edge 1b and outer edge 1a of the hand member 1, a fitting portion 16 is formed in a prospective fitting portion of the frictional holding member 2.

In this embodiment, the fitting portion 16 is a portion thinner than its periphery, and includes a recess 16a on the upper surface side, and a recess 16b on the lower surface side. In this embodiment, the fitting portion 16 is formed as a thin portion by forming the recesses in the upper and lower surfaces of the hand member 1. However, the thin portion may also be formed by forming the recess in only one of the upper and lower surfaces. Also, as indicated by the alternate long and two short dashed line in FIG. 2C, a recess 16c connecting the upper-surface-side recess 16a and lower-surface-side recess 16b may also be formed in the side wall surface of the hand member 1. Since the fitting portion 16 is a portion thinner than its periphery, the frictional holding member 2 can be positioned by the fitting portion 16.

The frictional holding member 2 includes a fitting member 21 and a friction member 22. The fitting member 21 is a member which fits on the fitting portion 16. The friction member 22 is a member which forms a semiconductor wafer placement surface. Although the frictional holding member 2 can be formed by one member, the two-member arrangement of this embodiment facilitates achieving both the fitting force and the semiconductor wafer holding force.

In this embodiment, the fitting member 21 includes an upper wall portion 211, a lower wall portion 212, and a side wall portion 213 connecting the upper wall portion 211 and lower wall portion 212, and forms a U shape in a side view or as a vertical sectional shape. Each of the upper wall portion 211, lower wall portion 212, and side wall portion 213 is a plate-like member. The upper wall portion 211 and lower wall portion 212 are spaced apart from each other in the Z direction. The side wall portion 213 is a vertical wall connecting the end portions of the upper wall portion 211 and lower wall portion 212 in the lateral direction. The fitting member 21 is made of a metal material such as stainless steel, and can be formed by bending a flat plate-like metal material.

The upper wall portion 211 functions as a support portion of the friction member 22, and the friction member 22 is fixed on the upper surface of the upper wall portion 211. The friction member 22 can be fixed on the upper wall portion 211 by, e.g., contact bonding or adhesion. As shown in FIG. 2C, the upper wall portion 211, lower wall portion 212, and side wall portion 213 form a space S surrounded by them, and the space S is fitted on the fitting portion 16. The upper wall portion 211 and lower wall portion 212 clamp the fitting portion 16, and this clamping force fixes the frictional holding member 2 to the hand member 1.

In this embodiment, as shown in FIG. 2C, the lower wall portion 212 is, in a natural state, inclined to approach the upper wall portion 211 from the proximal end connected to the side wall portion 213 to the distal end (from the right to the left in FIG. 2C). As shown in FIG. 2B, when the frictional holding member 2 is attached to the hand member 1, the lower wall portion 212 is pushed downward by elastic deformation, so the upper wall portion 211 and lower wall portion 212 become parallel. In this state in which the frictional holding member 2 is attached to the hand member 1, an elastic restoring force is always acting on the lower wall portion 212, and this improves the clamping force of clamping the fitting portion 16.

The recess 16a has a shape corresponding to the upper wall portion 211, and the recess 16b has a shape corresponding to the lower wall portion 212. When the frictional holding member 2 is attached to the hand member 1, the upper and lower wall portions 211 and 212 are respectively fitted in the recesses 16a and 16b without a gap. This makes misalignment and removal of the frictional holding member 2 hardly occur.

The friction member 22 is a belt-like member which forms a semiconductor wafer placement surface, and made of rubber such as silicone rubber or a resin. When using silicone rubber, the holding performance can be increased by the adhesiveness of the rubber. When using the adhesive member like this, however, if the adhesive force is too large, the friction member 22 and a semiconductor wafer are not smoothly separated in some cases. Therefore, it is possible to perform, e.g., a surface roughening process, embossing, or cutting using a laser on the surface of the adhesive member having a high adhesiveness, thereby performing adjustment such that the adhesive force of the friction member 22 falls within a predetermined range.

In this embodiment, the friction member 22 is formed on a portion of the upper surface of the upper wall portion 211 except for the edge, and so formed as not to extend to the side of the upper wall portion 211. This makes it possible to prevent the edge of the friction member 22 from coming into contact with an external object and peeling off from the upper wall portion 211. An arbitrary shape can be adopted as the planar shape of the friction member 22. When using a rectangular shape as in this embodiment, however, it is possible to obtain a relatively large contact area with a semiconductor wafer. Also, chamfering or the like may also be performed on the corners of this rectangle. This can further increase the above-described "peeling" preventiveness.

In this embodiment as described above, the frictional holding member 2 is attached to the hand member 1 by fitting the frictional holding member 2 on the fitting portion 16 sideways. When replacing the frictional holding member 2 as an expandable, therefore, the frictional holding member 2 can easily be removed without using any tool or the like. That is, the replacement easiness of the frictional holding member 2 can be improved.

Also, machining of the fitting portion 16 is wide-range thinning, and hardly causes stress concentration to the machined portion of the hand member 1 compared to micromachining of, e.g., a screw hole or dovetail groove.

Even when the hand member 1 is a difficult-to-cut material, therefore, machining can be performed without any cracking or chipping.

Figure 3:
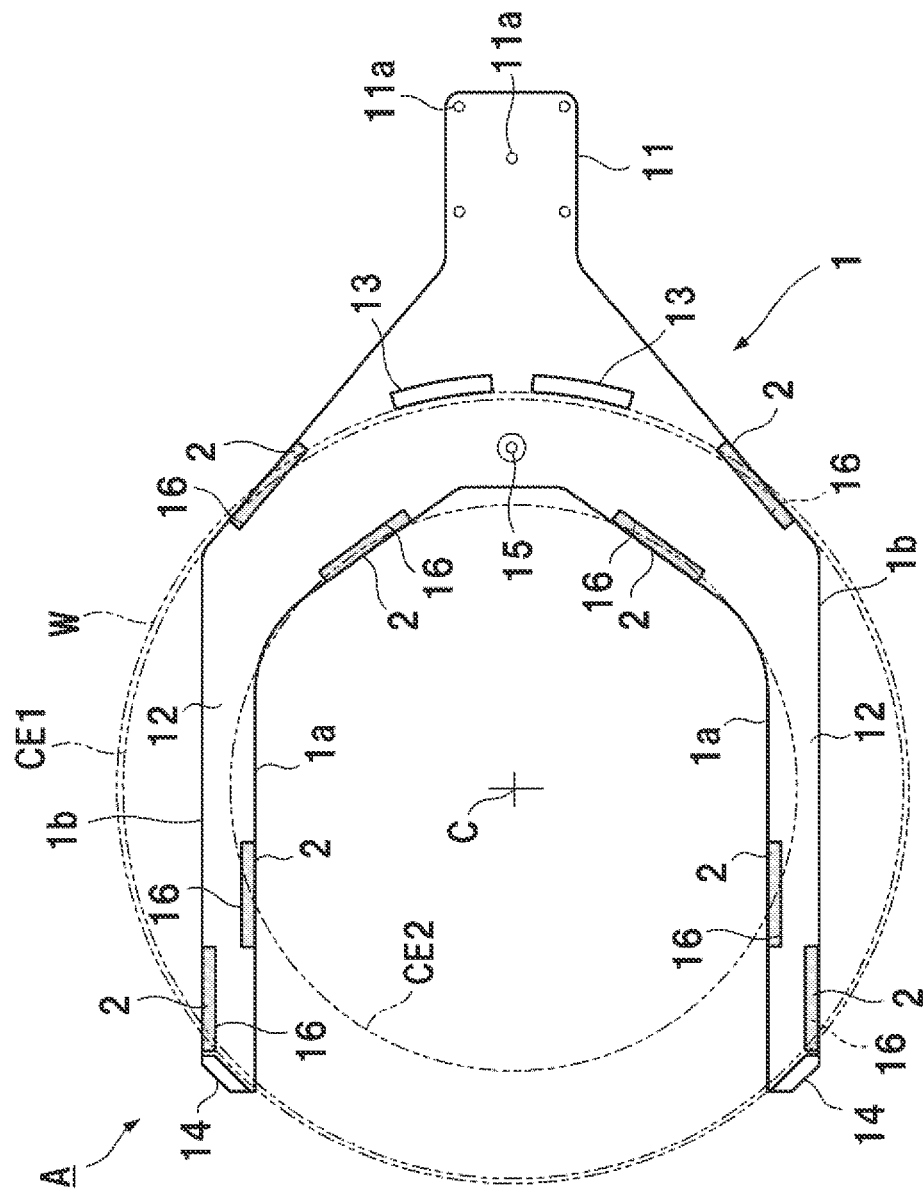
FIG. 3 is a plan view of the hand shown in FIG. 1.

Next, examples of the layout of the frictional holding members 2 and the corresponding fitting portions 16 will be explained. FIG. 3 is a plan view of the hand A, in which a circular semiconductor wafer W to be placed is indicated by the alternate long and two short dashed line. A point C indicates the central position of the semiconductor wafer W. In this embodiment, four frictional holding members 2 and four corresponding fitting portions 16 are laid out on the inner edge 1a of the hand member 1, and on the outer edge 1b thereof.

As already described, the frictional holding members 2 form support surfaces for the semiconductor wafer W to be placed. Since a plane is defined by three points, at least three frictional holding members 2 in total need only be laid out in positions against which the semiconductor wafer W abuts (i.e., the circle of the alternate long and two short dashed line indicating the semiconductor wafer W and the inside of this circle in FIG. 3). If the area of the friction member 22 is large, however, two frictional holding members 2 in total need only be laid out in some cases.

The semiconductor wafer W is sometimes curved by a heat treatment. Since the frictional holding members 2 are laid out on the inner edge 1a and outer edge 1b of the hand member 1, it is possible to hold not only a straight semiconductor wafer W but also a curved semiconductor wafer W. FIGS. 4A and 4B are views for explaining this.

FIG. 4A shows a case in which the semiconductor wafer W warps upward. In this case, the frictional holding members 2 laid out on the outer edge 1b abut against the semiconductor wafer W. FIG. 4B shows a case in which the semiconductor wafer W warps downward. In this case, the frictional holding members 2 laid out on the inner edge 1a abut against the semiconductor wafer W.

As described above, the frictional holding members 2 are laid out on the inner edge 1a and outer edge 1b of the hand member 1. Even when the semiconductor wafer W is curved, therefore, the semiconductor wafer W can reliably be held regardless of the warping direction of the curve. Since a plane is defined by three points, it is favorable to lay out at least three frictional holding members 2 on the inner edge 1a, and at least three frictional holding members 2 on the outer edge 1b, in positions against which the semiconductor wafer W abuts (i.e., the circle indicated by the alternate long and two short dashed line and the inside of this circle in FIG. 3). In this embodiment, the four frictional holding members 2 laid out on the inner edge 1a and the four frictional holding members 2 laid out on the outer edge 1b are all laid out in positions against which the semiconductor wafer W abuts. Also, the frictional holding members 2 laid out on the outer edge 1b are laid out in positions through which a virtual circle CE1 centered on the point C passes, and hence can reliably hold the semiconductor wafer W curved by upward warp shown in FIG. 4A. Similarly, the frictional holding members 2 laid out on the inner edge 1a are laid out in positions through which a virtual circle CE2 centered on the point C passes, and hence can reliably hold the semiconductor wafer W curved by downward warp shown in FIG. 4B.

Other Embodiments

The layout and number of the frictional holding members 2 and corresponding fitting portions 16 can properly be designed in accordance with, e.g., the shape of the hand member 1, and expected semiconductor wafer curved states.

Figure 5A:
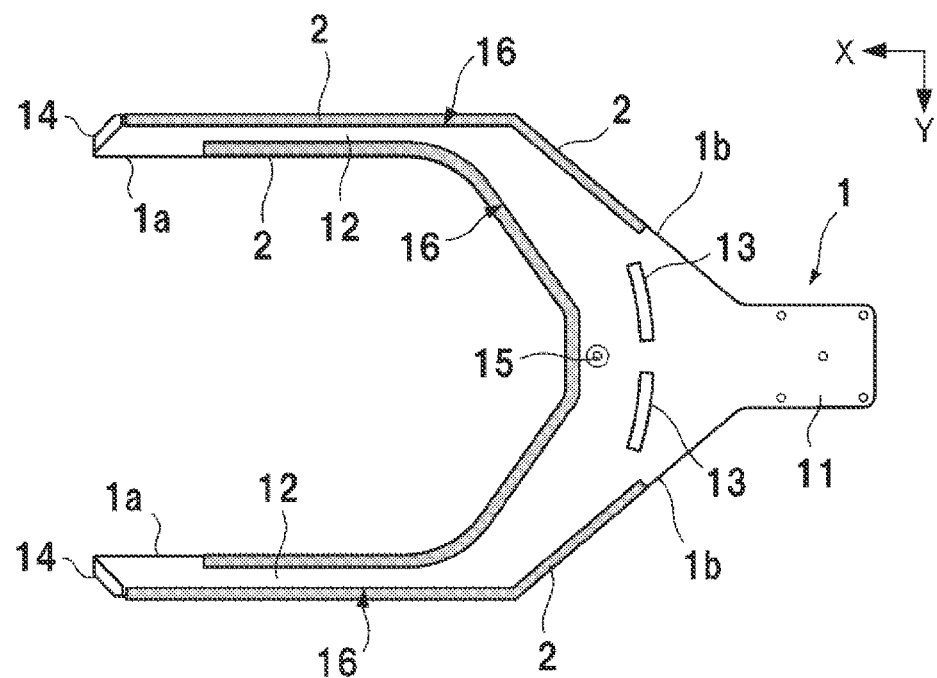
FIGS. 5A and 5B are views showing other examples of the layout of the frictional holding members.

FIG. 5A shows an example in which the four frictional holding members 2 laid out on the inner edge 1a shown in FIG. 3 are integrated. In addition, the four frictional holding members 2 laid out on the outer edge 1b shown in FIG. 3 are similarly integrated two by two on the left and right sides. A total of three frictional holding members 2 are laid out, and three corresponding fitting portions 16 are laid out.

Figure 5B:
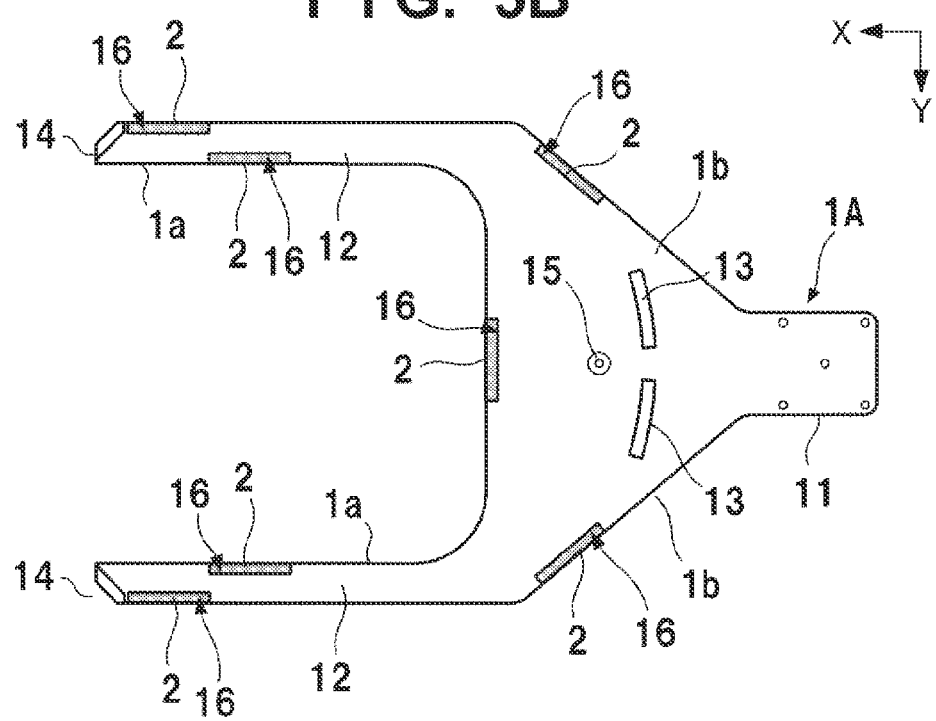

FIG. 5B shows an example adopting a hand member 1A having a shape different from that of the hand member 1. The contour shape of the inner edge 1a of the U-shaped hand member 1A is more squarish than that of the hand member 1. On the inner edge 1a, the frictional holding members 2 are laid out on the three sides, i.e., a total of three frictional holding members 2 are laid out. The number of frictional holding members 2 laid out on the outer edge 1b is four, i.e., the same as that of the hand member 1. Accordingly, seven fitting portions 16 are laid out on the hand member 1A.

FIGS. 6A to 7B show other examples of the frictional holding member 2 and fitting portion 16. In these examples, it is assumed that the thickness of the inner edge 1a and outer edge 1b is a thickness by which the frictional holding member 2 can fit, i.e., the same thickness as that of the hand member 1 over the whole area.

Figure 6A:
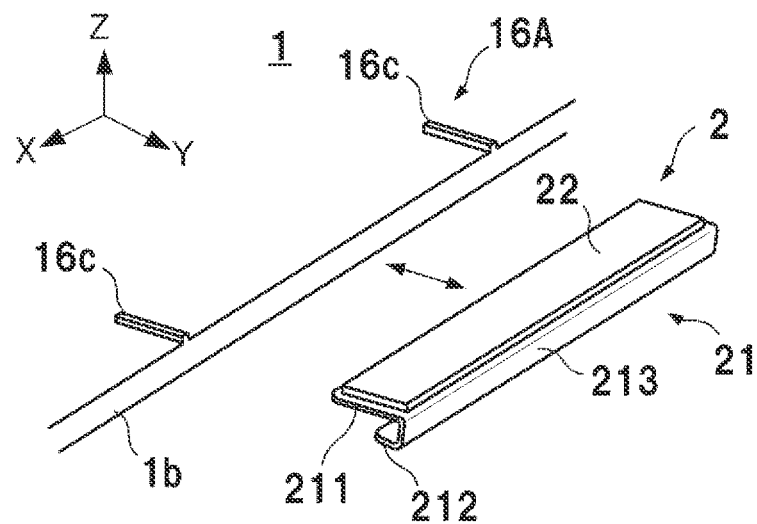
FIGS. 6A and 6B are views showing other examples of the fitting portion.

A fitting portion 16A shown in FIG. 6A indicates an example in which a pair of projections 16c for defining the position of the upper wall portion 211 of the frictional holding member 2 are formed on the upper surface of the hand member 1. The pair of projections 16c are spaced apart by the width (the length in the X direction in FIG. 6A) of the upper wall portion 211, and contribute to positioning of the frictional holding member 2 in the widthwise direction. It is also possible to form a pair of projections 16c on the lower surface of the hand member 1, as members for defining the position of the lower wall portion 212.

Figure 6B:
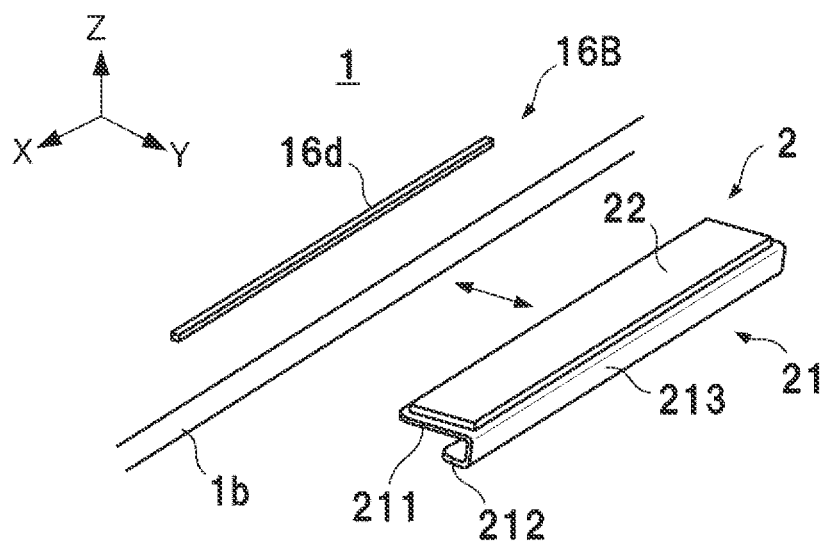

A fitting portion 16B shown in FIG. 6B indicates an example in which a projection 16d for defining the position of the upper wall portion 211 of the frictional holding member 2 is formed on the upper surface of the hand member 1. The projection 16d is spaced apart from the end face of the outer wall portion 1b by the length (the length in the Y direction in FIG. 6B) of the upper wall portion 211, and contributes to positioning (a fitting depth) of the frictional holding member 2 in the longitudinal direction. It is also possible to form a projection 16d on the lower surface of the hand member 1, as a member for defining the position of the lower wall portion 212.

Figure 7A:
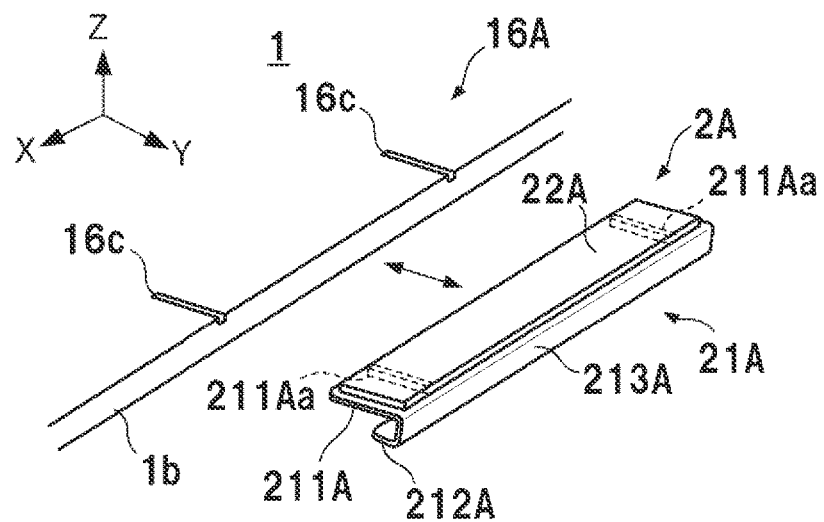
FIGS. 7A and 7B are views showing still other examples of the fitting portion.

A frictional holding member 2A and a fitting portion 16A shown in FIG. 7A indicate an example in which a pair of projections 211Aa are formed on the lower surface of an upper wall portion 211A, and a pair of grooves 16c are formed in the upper surface of the hand member 1. The pair of projections 211Aa are formed along the longitudinal direction (the Y direction in FIG. 7A) on the two side portions in the widthwise direction (the X direction in FIG. 7A) of the lower surface of the upper wall portion 211A. The pair of grooves 16c are formed in positions facing the pair of projections 211Aa of the fitting portion 16A. The pair of projections 211Aa and the pair of grooves 16c contribute to positioning of the frictional holding member 2A in the widthwise direction. It is also possible to form a pair of projections 212Aa on the lower wall portion 212A, and a pair of grooves 16c in the lower surface of the hand member 1, as members for defining the position of the lower wall portion 212A.

Figure 7B:
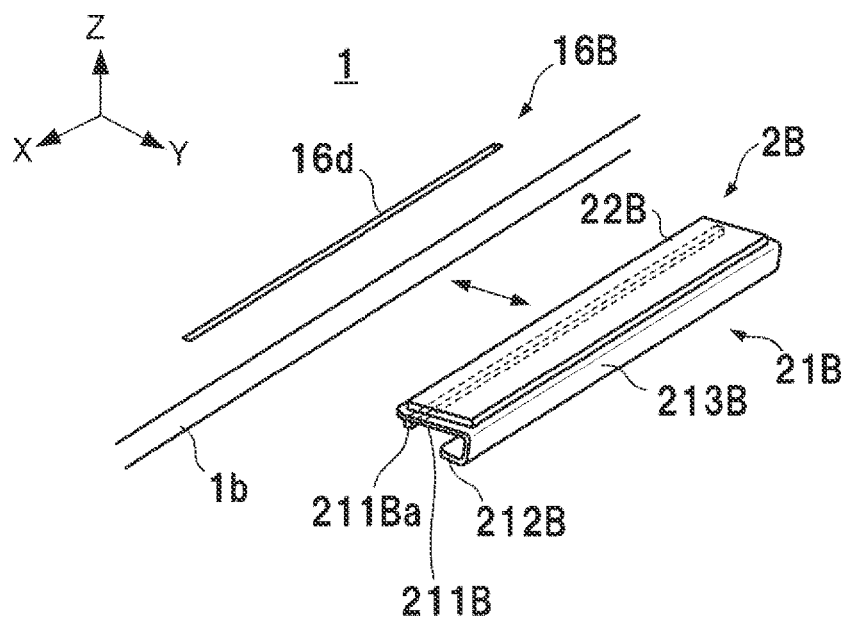

A frictional holding member 2B and a fitting portion 16B shown in FIG. 7B indicate an example in which a projection 211Ba is formed on the lower surface of an upper wall portion 211B, and a groove 16d is formed in the upper surface of the hand member 1. The projection 211Ba is formed along the widthwise direction (the X direction in FIG. 7B) on the distal end portion of the upper wall portion 211B. The groove 16d is formed in a position facing the projection 211Ba of the fitting portion 16B. The projection 211Ba and groove 16d contribute to positioning (a fitting depth) in the longitudinal direction of the frictional holding member 2B. It is also possible to form a projection 212Ba on the lower wall portion 212B, and a groove 16d in the lower surface of the hand member 1, as members for defining the position of the lower wall portion 212B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2015-228949, filed Nov. 24, 2015, which is hereby incorporated by reference herein in its entirety.

What is claimed is:

1. A hand member forming a hand of a robot arm for transferring a semiconductor wafer, wherein
the hand member is a U-shaped member on which the semiconductor wafer is placed,
the hand member comprises at least one fitting portion on which a frictional holding member for holding the semiconductor wafer is fitted sideways with respect to the hand member, on each of an inner edge and an outer edge, and
the at least one fitting portion includes:
a first recess on an upper surface of the hand member;
a second recess on an lower surface of the hand member; and
a third recess on a side surface of the hand member so as to connect the first and second recesses.

2. The hand member according to claim 1, wherein
at least three fitting portions are formed on the outer edge, and
at least three fitting portions are formed on the inner edge.

3. The hand member according to claim 1, further comprising a chucking portion.

4. A hand of a robot arm for transferring a semiconductor wafer, comprising:
a U-shaped hand member on which the semiconductor wafer is placed; and
a plurality of frictional holding members configured to hold the semiconductor wafer,
wherein the hand member comprises fitting portions on which the plurality of frictional holding members are fitted sideways with respect to the hand member, on an inner edge and an outer edge,
each frictional holding member includes an upper wall portion, a lower wall portion, and a side wall portion connecting the upper wall portion and the lower wall portion,
the lower wall portion is inclined to approach the upper wall portion from the side wall portion to a distal end portion, and
a space surrounded by the upper wall portion, the lower wall portion, and the side wall portion is fitted on one of the fitting portions.

5. The hand according to claim 4, wherein each frictional holding member includes a friction member configured to hold the semiconductor wafer, on an upper surface of the upper wall portion.

6. The hand according to claim 5, wherein the friction member is formed on a portion of the upper surface of the upper wall portion, except for an edge of the upper wall portion.

7. The hand according to claim 4, wherein each fitting portion is a portion thinner than a periphery thereof.

8. The hand according to claim 4, wherein at least three fitting portions in total are formed.

9. The hand according to claim 4, wherein
at least three fitting portions are formed on the outer edge of the hand member, and
at least three fitting portions are formed on the inner edge of the hand member.

10. The hand according to claim 4, wherein the hand member is made of a difficult-to-cut material.

11. The hand according to claim 4, further comprising a chucking portion formed in the hand member.

* * * * *